US009147483B2

United States Patent
Yoon et al.

(10) Patent No.: US 9,147,483 B2
(45) Date of Patent: Sep. 29, 2015

(54) APPARATUS AND METHOD OF OPERATING MEMORY DEVICE

(71) Applicant: Samsung Electronics Co., Ltd., Suwon-si, Gyeonggi-do (KR)

(72) Inventors: Hyun-Jun Yoon, Seongnam-si (KR); Jae-Yong Jeong, Yongin-si (KR); Myoung-Hoon Choi, Suwon-si (KR); Bo-Geun Kim, Suwon-si (KR); Ki-Tae Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 14/068,122

(22) Filed: Oct. 31, 2013

(65) Prior Publication Data

US 2014/0129902 A1 May 8, 2014

(30) Foreign Application Priority Data

Nov. 2, 2012 (KR) .................. 10-2012-0123646

(51) Int. Cl.
  *G11C 16/26* (2006.01)
  *G06F 11/10* (2006.01)
  *G11C 11/56* (2006.01)
  *G11C 16/34* (2006.01)
  *G11C 29/04* (2006.01)

(52) U.S. Cl.
  CPC ............ *G11C 16/26* (2013.01); *G06F 11/1048* (2013.01); *G11C 11/5642* (2013.01); *G11C 16/3422* (2013.01); *G11C 2029/0411* (2013.01); *G11C 2211/5641* (2013.01)

(58) Field of Classification Search
  CPC ............... G11C 11/5642; G11C 16/26; G11C 16/0483; G11C 2029/0411; G11C 16/3422; G11C 11/5628; G11C 2211/5641; G11C 29/00; G11C 29/021; G06F 11/1048; G06F 11/1072
  USPC ......... 714/773, 763, 764; 365/185.03, 185.09
  See application file for complete search history.

(56) References Cited

U.S. PATENT DOCUMENTS

| | | | | |
|---|---|---|---|---|
| 8,243,511 | B2 * | 8/2012 | Patapoutian et al. | 365/185.02 |
| 8,479,083 | B2 * | 7/2013 | Chae et al. | 714/780 |
| 8,510,636 | B2 * | 8/2013 | Ruby et al. | 714/773 |
| 8,510,637 | B2 * | 8/2013 | Tseng et al. | 714/773 |
| 8,683,297 | B2 * | 3/2014 | Jeon et al. | 714/769 |
| 2008/0109702 | A1 * | 5/2008 | Brandman | 714/763 |
| 2009/0164871 | A1 * | 6/2009 | Jo | 714/764 |
| 2010/0199138 | A1 * | 8/2010 | Rho | 714/746 |

(Continued)

FOREIGN PATENT DOCUMENTS

| | | |
|---|---|---|
| JP | 2008-226422 | 9/2008 |
| JP | 2009-146469 | 7/2009 |

(Continued)

*Primary Examiner* — James C Kerveros
(74) *Attorney, Agent, or Firm* — Ellsworth IP Group PLLC

(57) ABSTRACT

A memory device useable with a memory system includes a voltage generator to a plurality of first candidate voltages and a plurality of second candidate voltages, and an X decoder to sequentially apply each of the plurality of first candidate voltages and each of the plurality of second candidate voltages to one or more cells of a memory cell array, and then to apply one of the plurality of first candidate voltages and one of the plurality of second candidate voltages as a first read voltage and a second voltage, respectively, to read data from the cells of the memory cell array according to a characteristic of the cells of the memory cell array.

19 Claims, 9 Drawing Sheets

(56) References Cited

U.S. PATENT DOCUMENTS

| | | |
|---|---|---|
| 2010/0296350 A1 | 11/2010 | Kim et al. |
| 2010/0322007 A1 | 12/2010 | Jeon |
| 2011/0066899 A1 | 3/2011 | Kang et al. |
| 2011/0083039 A1 | 4/2011 | Kim et al. |
| 2011/0179306 A1* | 7/2011 | Huang ............... 714/6.11 |
| 2012/0005558 A1* | 1/2012 | Steiner et al. ........ 714/773 |
| 2012/0144267 A1* | 6/2012 | Yeh et al. ............ 714/763 |
| 2013/0073924 A1* | 3/2013 | D'Abreu et al. ...... 714/763 |
| 2013/0139035 A1* | 5/2013 | Zhong et al. ......... 714/773 |
| 2013/0198589 A1* | 8/2013 | Choi et al. ........... 714/773 |
| 2013/0297988 A1* | 11/2013 | Wu et al. ............. 714/773 |
| 2014/0059406 A1* | 2/2014 | Hyun et al. .......... 714/773 |

FOREIGN PATENT DOCUMENTS

| | | |
|---|---|---|
| KR | 1020090048108 | 5/2009 |
| KR | 1020090129205 | 12/2009 |
| KR | 1020100086193 | 7/2010 |
| KR | 10-2011-0061649 | 6/2011 |
| KR | 1020110116473 | 10/2011 |

* cited by examiner

APPARATUS AND METHOD OF OPERATING MEMORY DEVICE

CROSS-REFERENCE TO RELATED APPLICATIONS

This application claims priority under 35 U.S.C. §119(a) from Korean Patent Application No. 10-2012-0123646 filed on Nov. 2, 2012 in the Korean Intellectual Property Office, the disclosure of which is incorporated herein by reference in its entirety.

BACKGROUND

1. Field

The present inventive concept relates to an apparatus and method of operating a memory device.

2. Description of the Related Art

Memory devices are classified into volatile memory devices and nonvolatile memory devices. The volatile memory devices lose stored data when the power supply is turned off. Examples of the volatile memory devices include static random access memories (SRAMs), dynamic random access memories (DRAMs), and synchronous dynamic random access memories (SDRAMs). On the other hand, the nonvolatile memory devices retain stored data even when the power supply is interrupted.

Examples of the nonvolatile memory devices include flash memories, read-only memories (ROMs), programmable read-only memories (PROMs), erasable programmable read-only memories (EPROMs), electrically erasable programmable read-only memories (EEPROMs), and resistive memories (e.g., phase-change random access memories (PRAMs), ferroelectric random access memories (FRAMs), and resistive random access memories (RRAMs)).

A flash memory may perform an electric erase operation on a block-by-block basis and a program operation on a bit-by-bit basis.

Threshold voltages of a plurality of programmed memory cells included in a flash memory may change due to various causes. A change in the threshold voltages of the memory cells can undermine the reliability of read data.

SUMMARY

The present inventive concept provides an apparatus and method of operating a memory device, the method being employed to improve the reliability of read data and enhance read performance.

Additional features and utilities of the present general inventive concept will be set forth in part in the description which follows and, in part, will be obvious from the description, or may be learned by practice of the general inventive concept The foregoing and/or other features and utilities of the present general inventive concept may be achieved by providing a memory system including a nonvolatile memory device having a plurality of memory cells into which data is programmed, and a controller to control the nonvolatile memory device. The controller may include a microprocessor to change a first read voltage, which is used to determine whether the data stored in the memory cells is a first voltage state or a second voltage state, to a first select read voltage which is any one of n candidate voltages different from each other by a first voltage, and to change a second read voltage, which is used to determine whether the data stored in the memory cells is a third voltage state or a fourth voltage state, to a second select read voltage which is any one of m candidate voltages different from each other by a second voltage which is different from the first voltage, where n and m are natural numbers, an error correction code (ECC) encoder to create data added with parity bits by performing ECC encoding on data which is to be provided to the nonvolatile memory device, and an ECC decoder to correct error bits of the data added with the parity bits. The nonvolatile memory device may include a voltage generator to generate the first and second read voltages, the n candidate voltages, and the m candidate voltages, an X decoder to receive the first and second read voltages and the first and second select read voltages generated by the voltage generator and to drive the memory cells using the first and second read voltages and the first and second select read voltages; and a register storing the first and second select read voltages.

The foregoing and/or other features and utilities of the present general inventive concept may also be achieved by providing a method of operating a memory device, the method including changing a first read voltage, which is used to determine whether data stored in memory cells is a first voltage state or a second voltage state, to a first select read voltage which is any one of n candidate voltages different from each other by a first voltage, where n is a natural number, and changing a second read voltage, which is used to determine whether the data stored in the memory cells is a third voltage state or a fourth voltage state, to a second select read voltage which is any one of m candidate voltages different from each other by a second voltage which is different from the first voltage, where m is a natural number. The changing of the first read voltage to the first select read voltage may include applying the n candidate voltages sequentially from a first start candidate voltage at intervals of the first voltage and selecting a k-th candidate voltage as the first select read voltage if a number of failed cells is smaller when the k-th candidate voltage is applied to the memory cells than when a (k+1)-th candidate voltage is applied to the memory cells. The changing of the second read voltage to the second select read voltage may include applying the m candidate voltages sequentially from a second start candidate voltage at intervals of the second voltage and selecting an l-th candidate voltage as the second select read voltage if the number of failed cells is smaller when the l-th candidate voltage is applied to the memory cells than when a (l+1)-th candidate voltage is applied to the memory cells, wherein k and l are natural numbers, and k<n, and l<m.

The foregoing and/or other features and utilities of the present general inventive concept may also be achieved by providing a non-transitory computer-readable medium to contain computer-readable medium to execute the method described above or hereinafter.

The foregoing and/or other features and utilities of the present general inventive concept may also be achieved by providing a memory device useable with a memory system, including a voltage generator to a plurality of first candidate voltages and a plurality of second candidate voltages, and an X decoder to sequentially apply each of the plurality of first candidate voltages and each of the plurality of second candidate voltages to one or more cells of a memory cell array, and then to apply one of the plurality of first candidate voltages and one of the plurality of second candidate voltages as a first read voltage and a second voltage, respectively, to read data from the cells of the memory cell array according to a characteristic of the cells of the memory cell array.

Each of the one or more cells of the memory cell array may include a multi-level cell to store more than two bits as data stored in each cell.

The memory system may include a controller connected to the memory device, and the controller may determine the number of failed cells according to read data associated with the sequentially applied first candidate voltages and the sequentially applied second candidate voltages as the characteristic of the cells of the memory cell array, determine the ones as the first read voltage and the second read voltage according to the determined number of failed cells, and output to an external device a signal representing the data read from the cells applied with the first read voltage and the second voltage.

The controller may not output the signal to the external device when data is read from the cells applied with the first candidate voltages and the second candidate voltages.

The memory device may further include a register to store the applied one of the first candidate voltages and the applied one of the second candidate voltages as the first read voltage and the second read voltage, respectively, such that data can be read regardless of a shift of threshold voltage distributions on the cells.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1A:
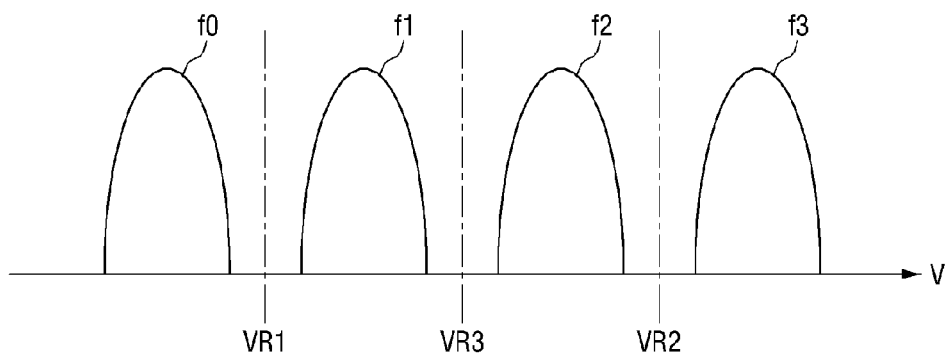
FIGS. 1A and 1B are diagrams illustrating voltage states of an MLC.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figure. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present inventive concept will now be described more fully with reference to the accompanying drawings, in which exemplary embodiments of the inventive concept are shown.

For ease of description, a case where the present inventive concept is applied to a 2-bit (multi-bit) or multi-level cell (MLC) will be described below. However, the present inventive concept is not limited to this case, and the present inventive concept can also be applied to a single-level cell (SLC) or a 3 or more-bit MLC.

A read voltage that varies according to the shift of threshold voltage distributions will now be described with reference to FIGS. 1A, 1B, and 2.

Figure 1B:
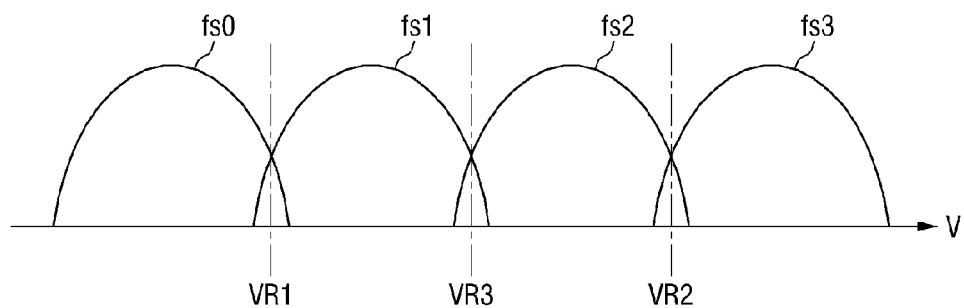
Figure 2:
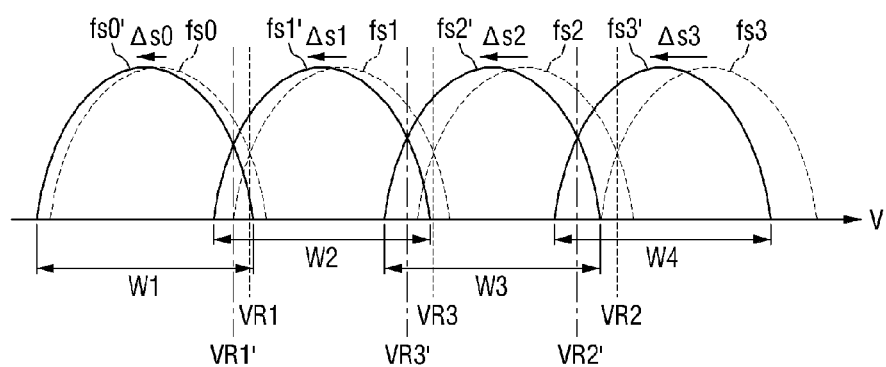
FIG. 2 is a diagram illustrating the shift of threshold voltage distributions.

FIGS. 1A and 1B are diagrams illustrating voltage states of an MLC, and FIG. 2 is a diagram illustrating the shift of threshold voltage distributions.

FIG. 1A is a diagram illustrating an ideal case of voltages states f0 through f3 of an MLC of a multi-bit memory device. Referring to FIG. 1A, a voltage of a 2-bit MLC into which data is programmed may be any one of four voltages states f0 through f3. For example, the first voltage state f0 may be an erase state E, and the second through fourth voltage states f1 through f3 may be first through third program states P1 through P3. However, the present inventive concept is not limited thereto.

In the ideal case, the voltage states f0 through f3 may be spaced at regular intervals as shown in FIG. 1A in order to provide a read margin between adjacent voltage states. In addition, each of the voltage states f0 through f3 may occupy a predetermined voltage range.

FIG. 1B is a diagram illustrating a realistic case of the voltages states fs0 through fs3 of the multi-bit memory device. Read errors do not occur as long as the voltage states fs0 through fs3 do not overlap each other as illustrated in FIG. 1A. However, the voltages states fs0 through fs3 may not be same but changed due to one or more characteristics of a memory device. Hence, the realistic voltage states fs0 through fs3 may be formed as illustrated in FIG. 1B due to coupling, charge leakage, and the like in the real memory device.

For example, if a first read voltage VR1 is applied to determine the first voltage state fs0 and the second voltage state fs1, the first voltage state fs0 and fs1 can be determined correctly in the ideal case of FIG. 1A. However, since the first voltage state fs0 and the second voltage state fs1 partially overlap each other in the realistic case of FIG. 1B, if a read operation is performed using the first read voltage VR1, the read operation cannot be properly performed, and data cannot be accurately read, that is, failed cells may be produced as a result. Here, a failed cell is a memory cell which fails to be read even if a read voltage is applied to the memory cell in order to read data programmed into the memory cell to a certain voltage state.

The failed cells can be corrected using error correction code (ECC).

The number of failed cells that can be corrected using the ECC is limited or the ECC may have a capacity to correct a limited amount of data associated with the failed cells. Therefore, a read voltage needs to be set efficiently before the ECC is performed or before the number of failed cells is greater than a reference number. The read voltage may be set to a voltage which produces a smallest number of failed cells, and the number of failed cells may be smallest at a place where each voltage state meets another voltage state. For example, referring to FIG. 1B, when the first voltage state fs0 and the second voltage state fs1 are read, the number of failed cells is smallest at an intersection of the first voltage state fs0 and the second voltage state fs1, that is, at the first read voltage VR1, in an area where the first voltage fs0 and the second voltage state fs1 overlap each other. When the third voltage state fs2 and the fourth voltage state fs3 are read, the number of failed cells is smallest at an intersection of the third voltage state fs2 and the fourth voltage state fs3, that is, at a second read voltage VR2, in an area where the third voltage fs2 and the fourth voltage state fs3 overlap each other. Lastly, when the second voltage state fs1 and the third voltage state fs2 are read, the number of failed cells is smallest at an intersection of the second voltage state fs1 and the third voltage state fs2, that is, at a third read voltage VR3, in an area where the second voltage fs1 and the third voltage state fs2 overlap each other.

The realistic voltage states fs0 through fs3 are not fixed but variable. Referring to FIG. 2, the first voltage state fs0 may be shifted by a first interval $\Delta s0$ to a first voltage state fs0', the second voltage state fs1 may be shifted by a second interval $\Delta s1$ to a second voltage state fs1', the third voltage state fs2 may be shifted by a third interval $\Delta s2$ to a third voltage state fs2', and the fourth voltage state fs3 may be shifted by a fourth interval $\Delta s3$ to a fourth voltage state fs3'. The first through fourth intervals $\Delta s0$ through $\Delta s3$ may be equal or different. For example, referring to FIG. 2, the interval may be larger in the order of, but not limited to, $\Delta s0 < \Delta s1 < \Delta s2 < \Delta s3$.

The voltage states fs0 through fs3 may be changed to the voltage states fs0' through fs3' as described above for various reasons including deterioration due to repeated erases and writes, characteristics of memory cells themselves, charge leakage which occurs a long time after data is programmed into the memory cells, coupling from an adjacent memory cell, external temperature, and characteristics of each layer in VNAND.

Although not illustrated in the drawing, respective widths W1 through W4 of the voltage states fs0 through fs3 may be increased for the above reasons.

The voltage states fs0' through fs3' may intersect each other at different locations from the locations at which the voltage states fs0 through fs3 intersect each other. Accordingly, the read voltage which produces the smallest number of failed cells may be changed. Specifically, referring to FIG. 2, when an area between the first voltage state fs0' and the second voltage state fs1' is read, the read voltage which produces the smallest number of failed cells is not the first read voltage VR1 but a first select read voltage VR1'. Likewise, when an area between the third voltage state fs2' and the fourth voltage state fs3' is read, the read voltage which produces the smallest number of failed cells is not the second read voltage VR2 but a second select read voltage VR2'. When an area between the second voltage state fs1' and the third voltage state fs2' is read, the read voltage which produces the smallest number of failed cells is not the third read voltage VR3 but a third select read voltage VR3'. Therefore, the read voltage needs to be reset according to the shift or change of the voltage states.

A method of operating a memory device according to a first embodiment of the present inventive concept will now be described with reference to FIGS. 3 through 5.

Figure 3:
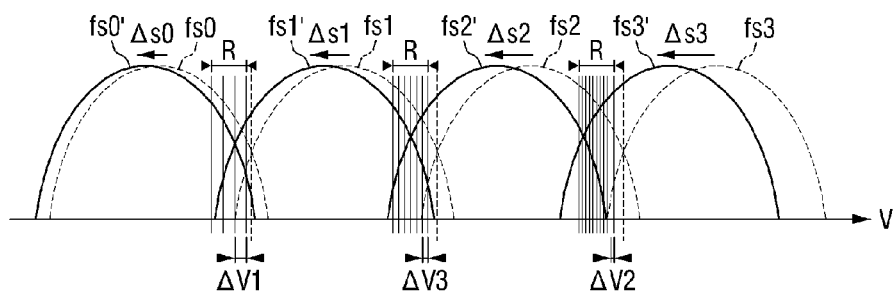
FIGS. 3 through 5 are diagrams illustrating a method of operating a memory device according to an exemplary embodiment of the present inventive concept.
Figure 4:
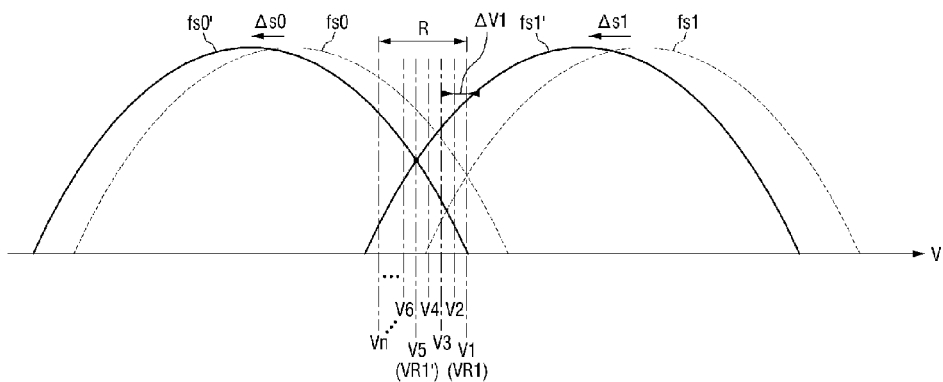
Figure 5:
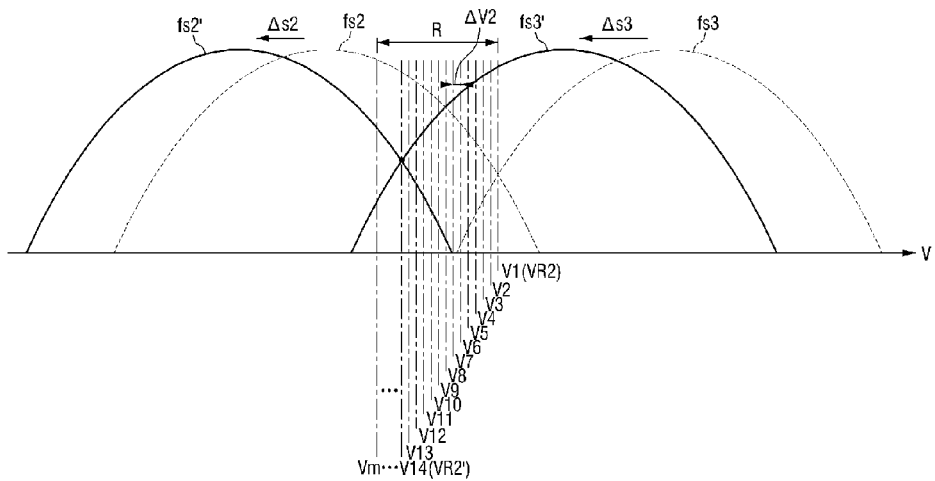

FIGS. 3 through 5 are diagrams illustrating a method of operating a memory device according to an embodiment of the present inventive concept.

First, a plurality of memory cells into which data is programmed are provided. The memory cells may be programmed to first through fourth voltage states fs0' through fs3'. Here, the first and second voltage states fs0' and fs1' may be different from the third and fourth voltage states fs2' and fs3'. In addition, since the first through fourth voltage states fs0' through fs3' are realistic voltage states, the first voltage state fs0' and the second voltage state fs1' may overlap each other, the second voltage state fs1' and the third voltage state fs2' may overlap each other, and the third voltage state fs2' and the fourth voltage state fs3' may overlap each other.

Next, it is determined whether the data stored in the memory cells is the first voltage state fs0' or the second voltage state fs1' by applying a first read voltage VR1. In the same way, it is determined whether the data stored in the memory cells is the third voltage state fs2' or the fourth voltage state fs3' by applying a second read voltage VR2.

Then, it is determined whether the number of failed cells is equal to or greater than a first limit value when the first read voltage VR1 is applied. Here, the first limit value is the number of failed cells that can be error-corrected using ECC.

Since the number of failed cells that can be corrected using the ECC is limited, if the number of failed cells exceeds the number of cells that can be error-corrected using the ECC when the data programmed into the memory cells is read using the first read voltage VR1, a read failure occurs. Therefore, the first limit value cannot exceed the number of failed cells that can be corrected using the ECC.

If the number of failed cells is equal to or greater than the first limit value when the first read voltage VR1 is applied, the first read voltage VR1 is changed. If the number of failed cells is less than the first limit value when the first read voltage VR1 is applied, it is not necessary to change the first read voltage VR1.

When the second read voltage VR2 is applied, it is also determined whether the number of failed cells exceeds a second limit value. Here, the second limit value is the number of bits that can be error-corrected using the ECC. When the number of failed cells is equal to or greater than the second limit value, the second read voltage VR2 is changed. When the number of failed cells is less than the second limit value, the second read voltage VR2 is not changed.

The first and second limit values may be equal. However, the first and second limit values can be set to different values in view of characteristics of each of the voltage states fs0' through fs3'.

The first and second read voltages VR1 and VR2 can be changed as follows.

Referring to FIGS. 3 and 4, a first select read voltage VR1' may be determined as follows. First, a first range R is determined. The first range R is an arbitrary range determined to find the first select read voltage VR1' which produces the smallest number of failed cells. The first select read voltage VR1' is selected within the first range R.

To find the first select read voltage VR1', n candidate voltages V1 through Vn in the first range R are applied. Here, n is a natural number, and the n candidate voltages V1 through Vn may be applied sequentially at intervals of a first voltage $\Delta V1$. In other words, the n candidate voltages V1 through Vn may be different from each other by the first voltage $\Delta V1$.

The numbers of failed cells produced when the candidate voltages V1 through Vn are applied are compared to select a candidate voltage which produces the smallest number of failed cells as the first select read voltage VR1'.

For example, referring to FIG. 4, a candidate voltage which can produce the smallest number of failed cells may be one of the candidate voltages V1 through Vn. The desired candidate voltage may be a candidate voltage V5 at an intersection of the first voltage state fs0' and the second voltage state fs1'. Therefore, the candidate voltage V5 is selected as the first select read voltage VR1'. In FIG. 4, the first select read voltage VR1' matches the intersection of the first voltage state fs0' and the second voltage state fs1'. However, the first select read voltage VR1' may not match the intersection of the first voltage state fs0' and the second voltage state fs1'. If no candidate voltage matches the intersection of the first voltage state fs0' and the second voltage state fs1', a candidate voltage closest to the intersection, that is, a candidate voltage which produces the smallest number of failed cells, may be selected as the first select read voltage VR1'.

A second select read voltage VR2' may be determined as follows. Referring to FIGS. 3 through 5, a first range R is determined. The first range R is an arbitrary range determined to find the second select read voltage VR2' which produces the smallest number of failed cells. The second select read voltage VR2' is selected within the first range R.

To find the second select read voltage VR2', m candidate voltages V1 through Vm in the first range R are applied. Here, m is a natural number, and the m candidate voltages V1 through Vm may be applied at intervals of a second voltage $\Delta V2$. In other words, the m candidate voltages V1 through Vm are different from each other by the second voltage $\Delta V2$.

The numbers of failed cells produced when the candidate voltages V1 through Vm are applied are compared to select a candidate voltage which produces the smallest number of failed cells as the second select read voltage VR2'.

For example, referring to FIG. 5, a candidate voltage which produces the smallest number of failed cells may be one of the candidate voltages V1 through Vm. The desired candidate voltage may be a candidate voltage V14 at an intersection of the third voltage state fs2' and the fourth voltage state fs3'. Therefore, the candidate voltage V14 is selected as the second select read voltage VR2'. In FIG. 5, the second select read voltage VR2' matches the intersection of the third voltage state fs2' and the fourth voltage state fs3'. However, the second select read voltage VR2' may not match the intersection of the third voltage state fs2' and the fourth voltage state fs3'. If no candidate voltage matches the intersection of the third voltage state fs2' and the fourth voltage state fs3', a candidate voltage closest to the intersection, that is, a candidate voltage which produces the smallest number of failed cells may be selected as the second select read voltage VR2'.

Referring to FIG. 3, the second voltage $\Delta V2$ may be different from the first voltage $\Delta V1$. This is because each voltage state may be shifted by a different amount. For example, referring to FIG. 3, a first voltage state fs0 was shifted by a first interval $\Delta s0$, a second voltage state fs1 was shifted by a second interval $\Delta s1$, a third voltage state fs2 was shifted by a third interval $\Delta s2$, and a fourth voltage state fs3 was shifted by a fourth interval $\Delta s3$. Since the intervals may become larger in the order of $\Delta s0 < \Delta s1 < \Delta s2 < \Delta s3$, the first and second voltage states fs0 and fs1 were shifted by smaller amounts than the third and fourth voltage states fs2 and fs3. Therefore, a difference between the second read voltage VR2 and a voltage at the intersection of the third and fourth voltage states fs2' and fs3' is greater than a difference between the first read voltage VR1 and a voltage at the intersection of the first and second voltage states fs0' and fs1'. As the difference between a voltage at an intersection of different voltage states and a read voltage applied to determine the different voltage states is increased according to levels of the different voltages, a select read voltage needs to be found more accurately and precisely. Therefore, the interval between candidate voltages may be reduced. That is, due to the differences in the amounts by which the first through fourth voltage states fs0 through fs3 are shifted, the second voltage $\Delta V2$ to find the second select read voltage VR2' may be smaller than the first voltage $\Delta V1$ to find the first select read voltage VR1'.

Since the first ranges R are equal and the second voltage $\Delta V2$ is smaller than the first voltage $\Delta V1$, the number of the candidate voltages V1 through Vm spaced at the intervals of the second voltage $\Delta V2$ may be greater than the number of the candidate voltages V1 through Vn spaced at the intervals of the first voltage $\Delta V1$. Thus, m may be greater than n. Unlike the illustration in the drawings, if the second voltage $\Delta V2$ is larger than the first voltage $\Delta V1$, m may be smaller than n.

If the interval between candidate voltages used to find a select read voltage is set according to the amount by which each voltage state is shifted, the select read voltage can be found rapidly and accurately. Referring to FIG. 3, when the amounts ($\Delta s0$ and $\Delta s1$) by which the first and second voltage states fs0 and fs1 are shifted are not greater with respect to the first and second voltage states fs0 and fs1 or not greater than a reference, the first select read voltage VR1' is not greatly different from the first read voltage VR1. Therefore, the first voltage ΔV1 may be set to a value greater than a reference value in order to quickly find the first select read voltage VR1'. A greater interval between candidate voltages results in a smaller number of candidate voltages. Therefore, the first read voltage VR1 can be rapidly changed to the first select read voltage VR1'. On the other hand, referring to FIG. 3, when the amounts (Δs2 and Δs3) by which the third and fourth voltage states fs2 and fs3 are shifted are greater with respect to the third and fourth voltage states fs2 and fs3 or not greater than a reference, it is important to accurately find the second select read voltage VR2'. Therefore, candidate voltages needs to be spaced at (increased or decreased by) an interval of the second voltage ΔV2 which is smaller than the interval of the first voltage ΔV1.

A third read voltage VR3 between the second voltage state fs1 and the third voltage state fs2 may be changed in the same way as described above.

A method of operating a memory device according to an embodiment of the present inventive concept will now be described with reference to FIGS. 6 and 7. For simplicity, a description of elements and features identical to those described above with reference to FIGS. 4 and 5 will be omitted, and the following description will focus on differences.

Figure 6:
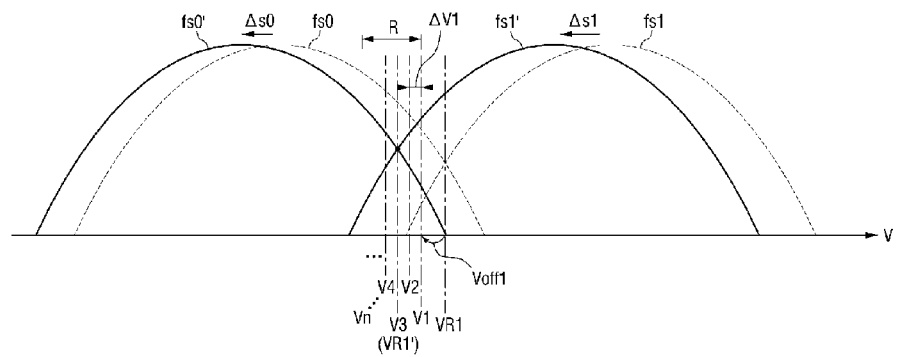
FIGS. 6 and 7 are diagrams illustrating a method of operating a memory device according to an exemplary embodiment of the present inventive concept.
Figure 7:
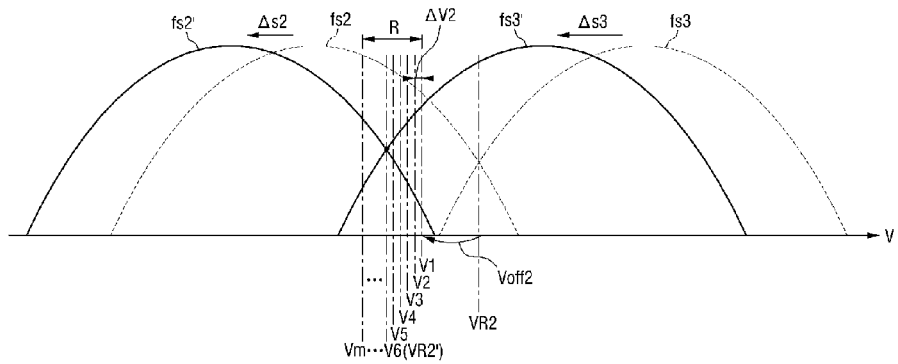

FIGS. 6 and 7 are diagrams illustrating a method of operating a memory device according to an embodiment of the present inventive concept.

Referring to FIG. 6, unlike in FIG. 4, a first read voltage VR1 is not included in a first range R. In FIG. 4, one (e.g., the candidate voltage V1) of the candidate voltages V1 through Vn is determined as the first read voltage VR1, and the first select read voltage VR1' is searched using the candidate voltage V1. However, in FIG. 6, the first read voltage VR1 is not included in the first range R. Of candidate voltages V1 through Vn, a candidate voltage V1 closest to the first read voltage VR1 may be separated (different) from the first read voltage VR1 by a first offset voltage Voff1.

Referring to FIG. 7, unlike in FIG. 5, a second read voltage VR2 is not included in a first range R. Specifically, in FIG. 5, one (e.g., the candidate voltage V1) of the candidate voltages V1 through Vm is determined as the second read voltage VR2, and the second select read voltage VR2' is searched using the candidate voltage V1. However, in FIG. 7, the second read voltage VR2 is not included in the first range R. Of candidate voltages V1 through Vm, a candidate voltage V1 closest to the second read voltage VR2 may be separated (different) from the second read voltage VR2 by a second offset voltage Voff2.

The first and second offset voltages Voff are arbitrary values and may be equal or different. The first and second offset voltages Voff may vary according to the purpose of use, characteristics, and the like of a memory device. The intervals of the first and/or second voltages ΔV1 and/or ΔV2 may be smaller than the first and second offset voltages Voff1 and/or Voff2. However, the present general inventive concept is not limited thereto. The intervals of the first and/or second voltages ΔV1 and/or ΔV2 and the first and second offset voltages Voff1 an dVoff2 may be differently set according to a user or design preference.

If the first and second read voltages VR1 and VR2 are not included in the first range R as described above, the first range R can be reduced compared with the first range R in the method of operating a memory device according to the first embodiment of the present inventive concept. Ultimately, the reduced first range R may make it possible to rapidly determine the first and second select read voltages VR1' and VR2'.

A method of operating a memory device according to an embodiment of the present inventive concept will now be described with reference to FIGS. 8 and 9. For simplicity, a description of elements and features identical to those described above with reference to FIGS. 6 and 7 will be omitted, and the following description will focus on differences.

Figure 8:
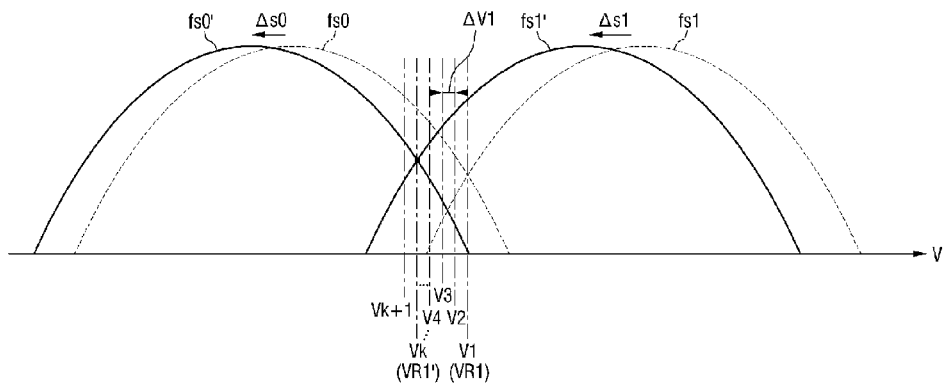
FIGS. 8 and 9 are diagrams illustrating a method of operating a memory device according to an exemplary embodiment of the present inventive concept.
Figure 9:
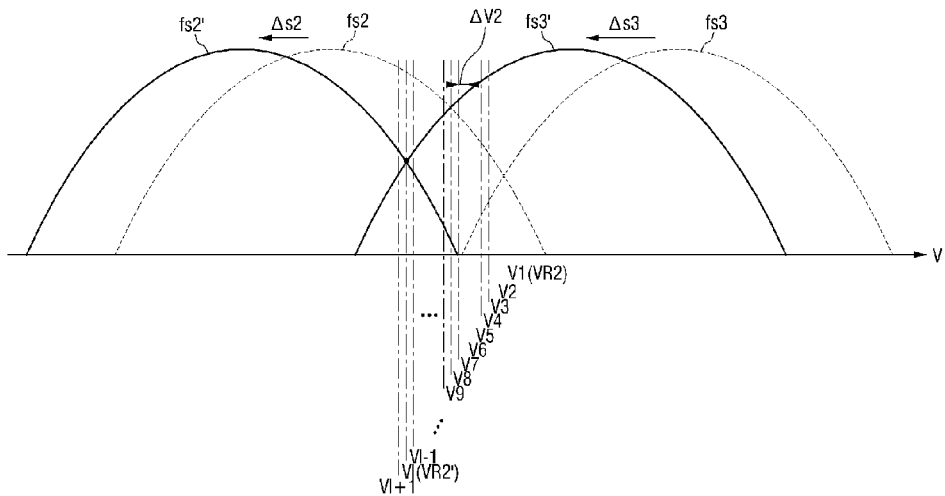

FIGS. 8 and 9 are diagrams illustrating a method of operating a memory device according to an embodiment of the present inventive concept.

Unlike in the method of operating a memory device according to the embodiment of FIGS. 4 and 5, in the method of operating a memory device according to the embodiment of FIGS. 8 and 9, a first range R does not exist, and a select read voltage is determined by sequentially applying candidate voltages.

First, referring to FIG. 8, a first select read voltage VR1' may be determined as follows. If the number of failed cells is equal to or greater than a first limit value when a first read voltage VR1 is applied, the first read voltage VR1 needs to be changed to a first select read voltage VR1'. Here, n candidate voltages V1 through Vn are applied sequentially from a first start candidate voltage V1 at intervals of a first voltage ΔV1. Specifically, the first start candidate voltage V1 is applied, and the number of failed cells at this time is counted. Then, a second candidate voltage V2 separated from the first start candidate voltage V1 by the first voltage ΔV1 is applied, and the number of failed cells at this time is counted. In this way, the number of failed cells is continuously counted by sequentially applying a third candidate voltage V3, a fourth candidate voltage V4, . . . .

When the number of failed cells is continuously counted by sequentially applying candidate voltages, there is a point at which the number of failed cells increases. For example, referring to FIG. 8, the number of failed cells continuously decreases from the first start candidate voltage V1 to a $k^{th}$ candidate voltage Vk. However, the number of failed cells is greater at a $(k+1)^{th}$ candidate voltage Vk+1 than at the $k^{th}$ candidate voltage Vk. This is because the $(k+1)^{th}$ candidate voltage Vk+1 is separated further from an intersection of a first state fs0' and a second state fs1' than the $k^{th}$ candidate voltage Vk. Therefore, if the number of failed cells increases after decreasing continuously, a candidate voltage immediately before the number of failed cells increases, that is, the $k^{th}$ candidate voltage Vk may be determined to be the first select read voltage VR1'. Here, k is a natural number smaller than n.

A second select read voltage VR2' may be determined in the same way as the first select read voltage VR1'. If the number of failed cells is equal to or greater than a second limit value when a second read voltage VR2 is applied, the second read voltage VR2 needs to be changed to a second select read voltage VR2'. Here, referring to FIG. 9, m candidate voltages V1 through Vm are applied sequentially from a first start candidate voltage V1 at intervals of a second voltage ΔV2. Specifically, the first start candidate voltage V1 is applied, and the number of failed cells at this time is counted. Then, a second candidate voltage V2 separated from the first start candidate voltage V1 by the second voltage ΔV2 is applied, and the number of failed cells at this time is counted. In this way, the number of failed cells is continuously counted by sequentially applying a third candidate voltage V3, a fourth candidate voltage V4, . . . .

When the number of failed cells is continuously counted by sequentially applying candidate voltages, there is a point at which the number of failed cells increases. For example, referring to FIG. 9, the number of failed cells continuously decreases from the first start candidate voltage V1 to an $l^{th}$ candidate voltage Vl. However, the number of failed cells is greater at a $(l+1)^{th}$ candidate voltage Vl+1 than at the $l^{th}$ candidate voltage Vl. This is because the $(l+1)^{th}$ candidate voltage Vl+1 is separated further from an intersection of a third state fs2' and a fourth state fs3' than the $l^{th}$ candidate voltage Vl. Therefore, if the number of failed cells increases after decreasing continuously, a candidate voltage immediately before the number of failed cells increases, that is, the $l^{th}$ candidate voltage Vl may be determined to be the second select read voltage VR2'. Here, l is a natural number smaller than m.

If a select read voltage is determined by sequentially applying candidate voltages as in the third embodiment of the present inventive concept, it is necessary to apply all of the n candidate voltages to determine the first select read voltage VR1' and all of the m candidate voltages V1 through Vm to determine the second select read voltage VR2'. Instead, k (smaller than n) candidate voltages and l (smaller than m) candidate voltages may be applied. Therefore, the first and second select voltages VR1' and VR2' can be found more rapidly.

A method of operating a memory device according to an embodiment of the present inventive concept will now be described with reference to FIGS. 10 and 11. For simplicity, a description of elements and features identical to those described above will be omitted, and the following description will focus on differences.

Figure 10:
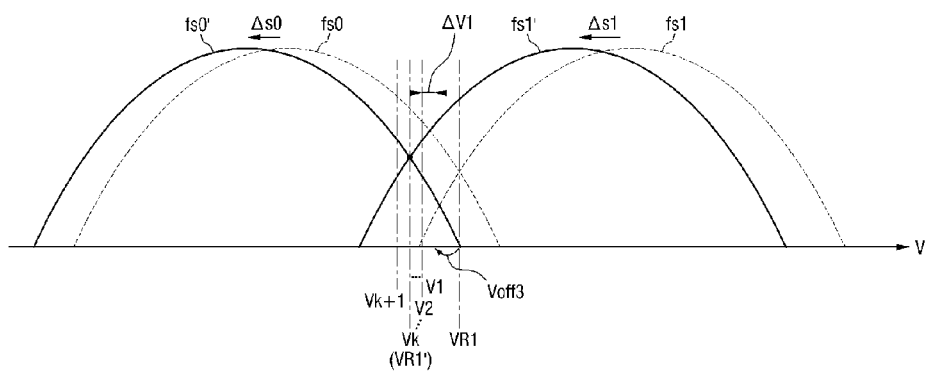
FIGS. 10 and 11 are diagrams illustrating a method of operating a memory device according to an exemplary embodiment of the present inventive concept.
Figure 11:
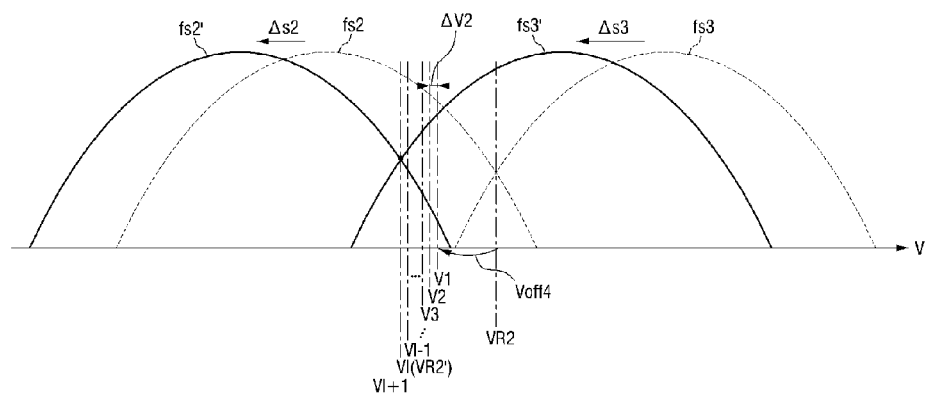

FIGS. 10 and 11 are diagrams illustrating a method of operating a memory device according to an embodiment of the present inventive concept.

Referring to FIG. 10, unlike in the method of operating a memory device according to the embodiment of FIGS. 8 and 9, in the method of operating a memory device according to the embodiment of FIGS. 10 and 11, a first start candidate voltage V1 does not match a first read voltage VR1. As described in FIG. 8, the first read voltage VR1 is the first start candidate voltage V1, and candidate voltages are applied sequentially from the first start candidate voltage V1 at the intervals of the first voltage ΔV1 to find the first select read voltage VR1'. However, as illustrated in FIG. 10, the first start candidate voltage V1 is separated (different) from the first read voltage VR1 by a third offset voltage Voff3, and the first read voltage VR1 does not overlap candidate voltages V1 through Vn.

Referring to FIG. 11, unlike in the method of operating a memory device according to the embodiment of FIGS. 8 and 9, in the method of operating a memory device according to the embodiment of FIGS. 10 and 11, a first start candidate voltage V1 does not match a second read voltage VR2. As described in FIG. 9, the second read voltage VR2 is the first start candidate voltage V1, and candidate voltages are applied sequentially from the first start candidate voltage V1 at the intervals of the second voltage ΔV2 to find the second select read voltage VR2'. However, as illustrated in FIG. 11, the first start candidate voltage V1 is separated from the second read voltage VR2 by a fourth offset voltage Voff4, and the second read voltage VR1 does not overlap candidate voltages V1 through Vm.

If the first and second read voltages VR1 and VR2 do not overlap the candidate voltages V1 through Vn and V1 through Vm as described above, the number of candidate voltages applied can be reduced compared with the number of candidate voltages applied in the method of driving a memory device according to the embodiment of FIGS. 8 and 9. That is, the reduced number of candidate voltages applied makes it possible to quickly determine first and second select read voltages VR1' and VR2', thereby improving the performance of a memory device.

A first memory system according to an exemplary embodiment of the present inventive concept will now be described with reference to FIG. 12.

Figure 12:
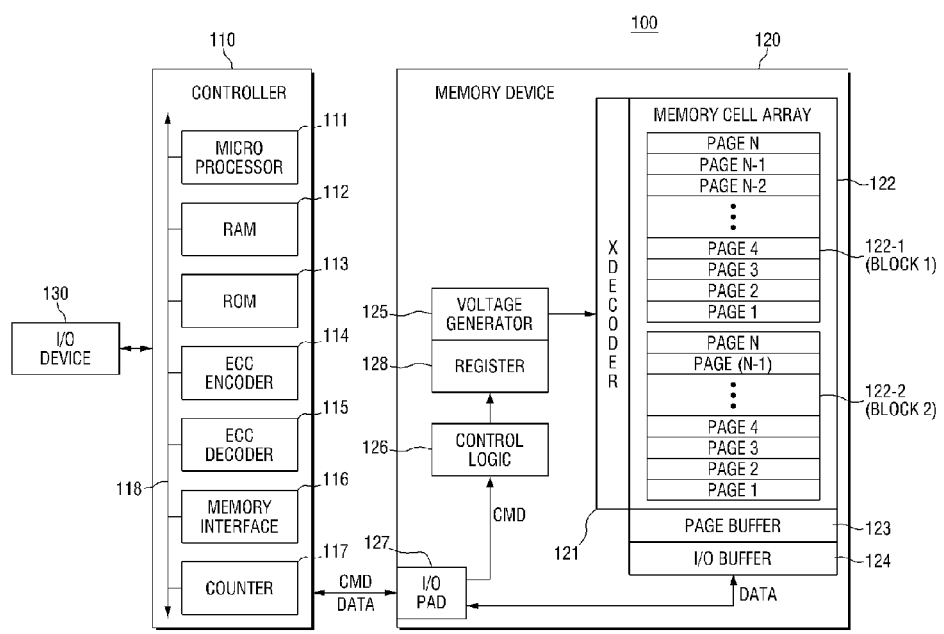
FIG. 12 is a block diagram illustrating a first memory system 100 according to an exemplary embodiment of the present inventive concept.

FIG. 12 is a block diagram illustrating a first memory system 100 according to an embodiment of the present inventive concept.

Referring to FIG. 12, the first memory system 100 includes a controller 110, a nonvolatile memory device 120, and an input/output (I/O) device 130. The nonvolatile memory device 120 may be, but is not limited to, a NAND flash memory device or a NOR flash memory device. The nonvolatile memory device 120 may include a planar memory cell structure and a 3D stacked memory cell structure.

The nonvolatile memory device 120 may include a memory cell array 122, an X decoder (a row selection circuit) 121, a voltage generator 125, an I/O pad 127, an I/O buffer 124, a page buffer 123, and a control logic 126.

The memory cell array 122 includes a plurality of memory cells into which data is programmed, a plurality of word lines W/L, and a plurality of bit lines B/L. Each of the memory cells may store 1-bit data or M-bit (multi-bit) data, where M is a natural number equal to or greater than two.

The memory cell array 122 may include a plurality of blocks and a plurality of pages. One block includes a plurality of pages. A page may be a unit of program and read operations, and a block may be a unit of erase operation. In a read operation, data programmed into one page is read.

The memory cell array 122 can be implemented as a single-layer array structure (also called a 2D array structure) or a multi-layer array structure (also called a 3D array structure). The memory cell array 122 may include blocks 122-1 and 122-2 to correspond to different types of memories. The block 122-1 may be single level cells (SLCs) and the block 122-2 may be multi level cells (MLCs).

The control logic 126 controls the overall operation of the nonvolatile memory device 120. When receiving a command CMD from the controller 110, the control logic 126 interprets the command CMD and controls the nonvolatile memory device 120 to perform an operation (such as a program operation, a read operation, a read retry operation, or an erase operation) corresponding to the interpreted command CMD. In addition, the control logic 126 determines whether the number of failed cells is equal to or greater than a first limit value when a first read voltage is applied to the memory cells and determines whether the number of failed cells is equal to or greater than a second limit value when a second read voltage is applied to the memory cells. Therefore, the control logic 126 may store determination results concerning the number of failed cells.

Under the control of the control logic 126, the voltage generator 125 generates one or more voltages required for a program operation, an operation of identifying target memory cells or an erase operation and provides at least one voltage selected by the X decoder 121. In addition, the voltage generator 125 may generate the first and second read voltages, n candidate voltages including a first select read voltage, and m candidate voltages including a second select read voltage.

The X decoder 121 is controlled by the control logic 126 and drives at least one of the word lines W/L implemented in the memory cell array 122 according to a row address. That is, the X-decoder 121 applies at least one voltage received from the voltage generator 125 to the memory cell array 122. For example, the X-decoder 121 receives the first and second read voltages and the first and second select read voltages from the voltage generator 125 and drives the memory cell array 122 using the received voltages.

A register 128 is a memory space which stores information input from the controller 110. The register 128 may include a plurality of latches. For example, the register 128 may store the first and second read voltages and the first and second select read voltages.

The page buffer 123 is controlled by the control logic 126 and operates as a sense amplifier or a write driver according to an operation mode (e.g., a read operation or a program operation).

The I/O pad 127 and the I/O buffer 124 may serve as a data I/O path between an external device (e.g., the controller 110) and the nonvolatile memory device 120.

The controller 110 may include a microprocessor 111, a read-only memory (ROM) 113, a random access memory (RAM) 112, an ECC decoder 115, an ECC encoder 114, a memory interface 116, a counter 117, and a bus 118. The above elements 111 through 117 of the controller 110 may be electrically connected to each other through the bus 118.

The microprocessor 111 controls the overall operation of the first memory system 100 including the controller 110. When power is supplied to the first memory system 100, the microprocessor 111 drives firmware (stored in the ROM 113) to operate the memory system 100 on the RAM 112, thereby controlling the overall operation of the first memory system 100. In addition, the microprocessor 111 may change the first read voltage, which is used to determine whether the data stored in the memory cells is a first voltage state or a second voltage state, to the first select read voltage which is any one of the n candidate voltages different from each other by a first voltage and may change the second read voltage, which is used to determine whether the data stored in the memory cells is a third voltage state or a fourth voltage state, to the second select read voltage which is any one of the m candidate voltages different from each other by a second voltage which is different from the first voltage.

Alternatively, the microprocessor 111 may select the first and second select read voltages in a different way. Specifically, the n candidate voltages are applied sequentially from a first start candidate voltage at the intervals of the first voltage. If the number of failed cells is smaller when a $k^{th}$ (k is a natural number, and k<n) candidate voltage is applied to the memory cells than when a $(k+1)^{th}$ candidate voltage is applied to the memory cells, the $k^{th}$ candidate voltage is selected as the first select read voltage. Also, the m candidate voltages are applied sequentially from a second start candidate voltage at the intervals of the second voltage. If the number of failed cells is smaller when an $l^{th}$ (l is a natural number, and l<m) candidate voltage is applied to the memory cells than when a $(l+1)^{th}$ candidate voltage is applied to the memory cells, the $l^{th}$ candidate voltage is selected as the second select read voltage.

In FIG. 12, a driver firmware code of the first memory system 100 is stored in the ROM 113. However, the scope of the present inventive concept is not limited thereto. The firmware code can also be stored in various nonvolatile memory devices 120 other than the ROM 113. Therefore, the control or intervention of the microprocessor 111 may encompass not only the direct control of the microprocessor 111 but also the intervention of firmware which is software driven by the microprocessor 111.

The first voltage and the second voltage may be stored in the ROM 113. However the present inventive concept is not limited thereto. For example, two or more voltages can be stored in the ROM 113. The microprocessor 111 may determine the first and second select read voltages using the first and second voltages stored in the ROM 113.

The RAM 112, which is a memory serving as a buffer, may store an initial command, data, and various variables input from a host or data output from the nonvolatile memory device 120. The RAM 112 may store data and various parameters and variables input to and output from the nonvolatile memory device 120. For example, the RAM 112 may store the number of failed cells produced when each of the n candidate voltages is applied and the number of failed cells produced when each of the m candidate voltages is applied, so that the microprocessor 111 can determine the first and second select read voltages.

The memory interface 116 may serve as an interface between the controller 110 and the nonvolatile memory device 120. The memory interface 116 is connected to the I/O pad 127 of the nonvolatile memory device 120 and may exchange data with the I/O pad 127. In addition, the memory interface 116 may create a command appropriate for the nonvolatile memory device 120 and provide the created command appropriate for the nonvolatile memory device 120 to the I/O pad 127. The memory interface 116 provides a command to be executed by the nonvolatile memory device 120 and an address ADD of the nonvolatile memory device 120.

The ECC decoder 115 and the ECC encoder 114 perform error bit correction. The ECC encoder 114 generates data added with parity bits by performing error correction encoding on data which is to be provided to the nonvolatile memory device 120. The parity bits may be stored in the nonvolatile memory device 120.

The ECC decoder 115 performs error correction decoding on output data, determines whether the error correction decoding is successful based on the result of the error correction decoding, and outputs an instruction signal based on the determination result. Read data may be transmitted to the ECC decoder 115, and the ECC decoder 115 may correct error bits of the data using parity bits. For example, the ECC decoder 115 may correct error bits of data programmed into failed cells by correcting the failed cells produced when the first and second read voltages or the first and second select read voltages are applied. When the number of error bits exceeds a maximum number of error bits that can be corrected, the ECC decoder 115 cannot correct the error bits, resulting in an error correction failure. The ECC encoder 114 and the ECC decoder 115 may perform error correction using, but not limited to, low density parity check (LDPC) code, BCH code, turbo code, Reed-Solomon code, convolution code, recursive systematic code (RSC), or coded modulation such as trellis-coded modulation (TCM) or block coded modulation (BCM).

Each of the ECC encoder 114 and the ECC decoder 115 may include an error correction circuit, system or device.

The memory interface 116 provides a read command and an address to the nonvolatile memory device 120. The nonvolatile memory device 120 reads data stored in pages of a first block 123 corresponding to the received address. The read data is provided to the ECC decoder 115 via the I/O pad 127. The ECC decoder 115 checks error bits of the data provided by the nonvolatile memory device 120 and corrects the error bits.

The I/O device 130 may be connected between a host (not illustrated) and the controller 110 to input/output data to/from the first memory system 100. For example, the I/O device 130 may deliver data to be programmed into the first memory system 100, receive data read by applying the first and second select read voltages from the first memory system 100, and output the received data.

A second memory system according to some embodiments of the present inventive concept and application examples thereof will now be described with reference to FIGS. 13 and 14. For simplicity, a repetitive description of elements identical to those of the first memory system 100 according to an embodiment of the present inventive concept will be omitted, and the following description will focus on differences from the first memory system 100.

Figure 13:
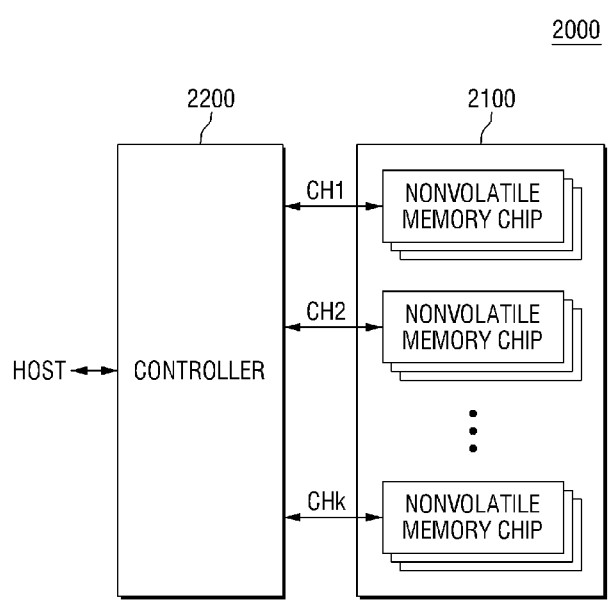
FIG. 13 is a block diagram illustrating a second memory system 2000 according to an exemplary embodiment of the present inventive concept.

FIG. 13 is a block diagram illustrating a second memory system 2000 according to an embodiment of the present inventive concept. FIG. 14 is a block diagram illustrating a computing system 3000 including the second memory system 2000 of FIG. 13.

Referring to FIG. 13, the second memory system 2000 includes a nonvolatile memory device 2100 and a controller 2200. The nonvolatile memory device 2100 includes a plurality of nonvolatile memory chips, each including a memory cell array 122 (see FIG. 12). The nonvolatile memory chips form multiple memory chip groups. Each of the memory chip groups has one common channel for communication with the controller 2200. For example, the nonvolatile memory chips may communicate with the controller 2200 through first through $k^{th}$ channels CH1 through CHk.

In FIG. 13, a plurality of nonvolatile memory chips are connected to one channel. However, the second memory system 2000 can be modified such that one nonvolatile memory chip is connected to one channel.

The controller 2200 and the nonvolatile memory device 2100 may be integrated into one semiconductor device. Specifically, the controller 2200 and the nonvolatile memory device 2100 may be integrated into one semiconductor device to form a memory card. For example, the controller 2200 and the nonvolatile memory device 2100 may be integrated into one semiconductor device to form a personal computer (PC) card (e.g., Personal Computer Memory Card International Association (PCMCIA)), a compact flash card (CF), a smart media card (SM, SMC), a memory stick, a multimedia card (e.g., MMC, RS-MMC, MMCmicro), a SD card (e.g., SD, miniSD, microSD, SDHC), or a universal flash storage (UFS).

Alternatively, the controller 2200 and the nonvolatile memory device 2100 may be integrated into one semiconductor device to form a solid state drive (SSD). The SSD includes a storage device which stores data in a semiconductor memory. When the second memory system 2000 is used as an SSD, the operation speed of a host connected to the second memory system 2000 may increase significantly.

The second memory system 2000 may be implemented in a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a three-dimensional television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, a radio frequency identification (RFID) device, or one of various components constituting a computing system.

The nonvolatile memory device 2100 or the second memory system 2000 may be mounted using various forms of packages. The nonvolatile memory device 2100 or the memory system 1000 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), and wafer-level processed stack package (WSP).

Figure 14:
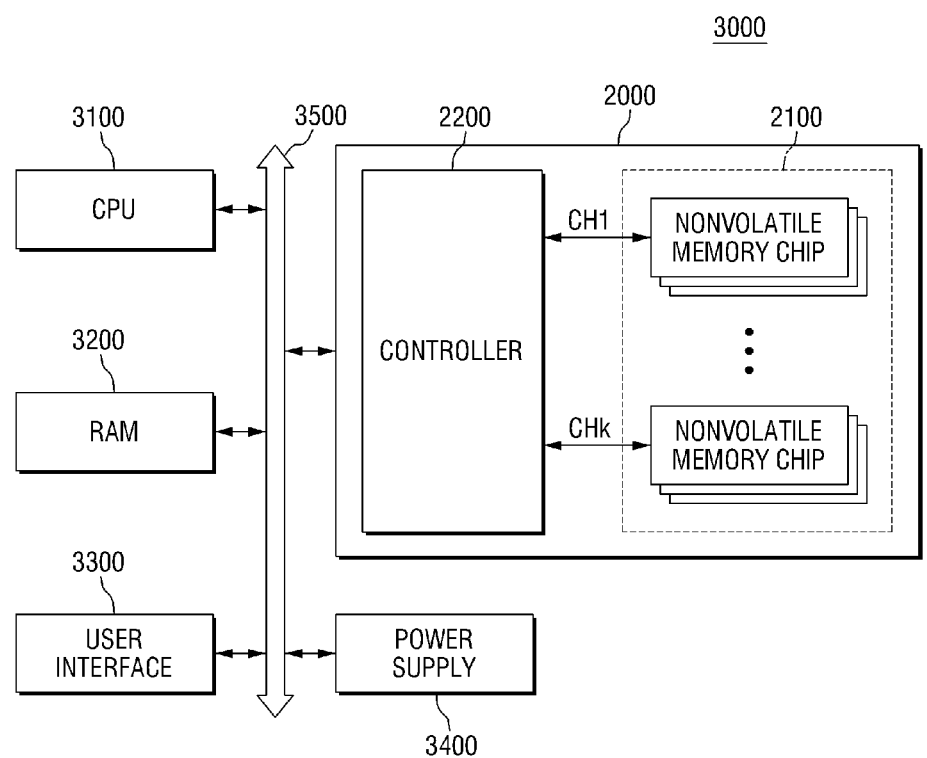
FIG. 14 is a block diagram illustrating a computing system 3000 including the second memory system 2000 of FIG. 13 according to an exemplary embodiment of the present general inventive concept.

Referring to FIG. 14, the computing system 3000 includes a central processing unit (CPU) 3100, a RAM 3200, a user interface 3300, a power supply 3400, and the second memory system 2000.

The second memory system 2000 is electrically connected to the CPU 3100, the RAM 3200, the user interface 3300, and the power supply 3400 through a system bus 3500. Data provided through the user interface 3300 or processed by the CPU 3100 is stored in the second memory system 2000.

In FIG. 14, the nonvolatile memory device 2100 is connected to the system bus 3500 through the controller 2200. However, the nonvolatile memory device 2100 can also be connected directly to the system bus 3500.

In FIG. 14, the second memory system 2000 described above with reference to FIG. 13 is provided. However, the memory system 2000 can be replaced by the first memory system 100 described above with reference to FIG. 12.

Alternatively, the computing system 3000 may include all of the memory systems 100 and 2000 described above with reference to FIGS. 12 and 13.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include a semiconductor memory, a read-only memory (ROM), a random-access memory (RAM), a USB memory, a memory card, a blue-ray disc, CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A memory system comprising:
   a nonvolatile memory device comprising:
   a plurality of memory cells configured to have data programmed therein;
   a voltage generator configured to generate first and second read voltages, first candidate voltages, and second candidate voltages, and the voltage generator further configured to generate a first select read voltage and a second select read voltage, the first select read voltage being a member of the first candidate voltages, and the second select read voltage being a member of the second candidate voltages;

an X decoder configured to receive the first and second read voltages and first and second select read voltages generated by the voltage generator and to drive the memory cells using the first and second read voltages and the first and second select read voltages; and a register to store the first and second select read voltages; and a controller to control the nonvolatile memory device, the controller comprising:

a microprocessor configured to change the first read voltage, which is voltage for first determining whether the data stored in the memory cells is a first voltage state or a second voltage state, to the first select read voltage based on a number of failed memory cells detecting when first determining whether the data stored in the memory cells is the first voltage state or the second voltage state, and the microprocessor further configured to change the second read voltage, which is a voltage for second determining whether the data stored in the memory cells is a third voltage state or a fourth voltage state, to the second select read voltage based on a number of failed memory cells detecting when second determining whether the data stored in the memory cells is the third voltage state or the fourth voltage state, wherein the first candidate voltages differ from each other by intervals of a first voltage, the second candidate voltages differ from each other by intervals of a second voltage, and the second voltage is different from the first voltage;

an error correction code (ECC) encoder configured to create data added with parity bits by performing ECC encoding on data which is to be provided to the nonvolatile memory device and an ECC decoder to correct error bits of the data added with the parity bits.

2. The memory system of claim 1, wherein the first and second voltage states are different from the third and fourth voltage states.

3. The memory system of claim 1, wherein the first voltage state and the second voltage state overlap each other, and the third voltage state and the fourth voltage state overlap each other.

4. The memory system of claim 3, wherein a difference between a voltage at an intersection of the third and fourth voltage states and the second read voltage is greater than a difference between a voltage at an intersection of the first and second voltage states and the first read voltage.

5. The memory system of claim 4, wherein the first voltage is smaller than the second voltage.

6. The memory system of claim 1, wherein the microprocessor changes the first read voltage if a number of failed cells is equal to or greater than a first limit value when the first read voltage is applied to the memory cells, does not change the first read voltage if the number of failed cells is less than the first limit value when the first read voltage is applied to the memory cells, changes the second read voltage if the number of failed cells is equal to or greater than a second limit value when the second read voltage is applied to the memory cells, and does not change the second read voltage if the number of failed cells is less than the second limit value.

7. The memory system of claim 6, wherein the first limit value and the second limit value are different.

8. The memory system of claim 6, wherein each of the first and second limit values is a number of memory cells that can be error-corrected using ECC.

9. The memory system of claim 1, wherein the first number and the second number are different.

10. The memory system of claim 1, wherein the first select read voltage is a candidate voltage which produces a smallest number of failed cells when the first candidate voltages are applied to the memory cells, and the second select read voltage is a candidate voltage which produces the smallest number of failed cells when the second candidate voltages are applied to the memory cells.

11. A method of operating a memory device, the method comprising:

changing a first read voltage, which is used to determine whether data stored in memory cells is a first voltage state or a second voltage state, to a first select read voltage which is any one of a first number of first candidate voltages different from each other by an interval of a first voltage; and changing a second read voltage, which is used to determine whether the data stored in the memory cells is a third voltage state or a fourth voltage state, to a second select read voltage which is any one of a second number of second candidate voltages different from each other by an interval of a second voltage which is different from the first voltage, wherein the changing of the first read voltage to the first select read voltage comprises applying the first candidate voltages sequentially from a first start candidate voltage at intervals of the first voltage and selecting a previous first candidate voltage as the first select read voltage if a number of failed cells is smaller when the previous first candidate voltage is applied to the memory cells than when a present first candidate voltage is applied to the memory cells, and the changing of the second read voltage to the second select read voltage comprises applying the second candidate voltages sequentially from a second start candidate voltage at intervals of the second voltage and selecting a previous second candidate voltage as the second select read voltage if the number of failed cells is smaller when the previous candidate voltage is applied to the memory cells than when a current candidate voltage is applied to the memory cells.

12. The method of claim 11, wherein the changing of the first read voltage comprises changing the first read voltage if the number of failed cells is equal to or greater than a first limit value when the first read voltage is applied to the memory cells and not changing the first read voltage if the number of failed cells is less than the first limit value when the first read voltage is applied to the memory cells, and the changing of the second read voltage comprises changing the second read voltage if the number of failed cells is equal to or greater than a second limit value when the second read voltage is applied to the memory cells and not changing the second read voltage if the number of failed cells is less than the second limit value.

13. The method of claim 12, wherein each of the first and second limit values is a number of memory cells that can be error-corrected using ECC.

14. The method of claim 11, wherein the first and second voltage states are different from the third and fourth voltage states.

15. The method of claim 11, wherein the first start candidate voltage is different from the first read voltage, and the second start candidate voltage is different from the second read voltage.

16. A memory system, comprising:
a memory device, comprising:
- a voltage generator to generate a plurality of first candidate voltages, each first candidate voltage differing from a next first candidate voltage by an interval of a first voltage, and a plurality of second candidate voltages, each second candidate voltage differing from a next second candidate voltage by an interval of a second voltage, the second voltage being different from the first voltage; and
- an X decoder to sequentially apply each of the plurality of first candidate voltages and each of the plurality of second candidate voltages to one or more cells of a memory cell array, and then to apply one of the plurality of first candidate voltages and one of the plurality of second candidate voltages as a first read voltage and a second read voltage, respectively, to read data from the cells of the memory cell array according to a characteristic of the cells of the memory cell array; and a controller configured to change the first read voltage, which is a voltage for first determining whether the data stored in the cells of the memory cell array is a first voltage state or a second voltage state, to the first select read voltage based on a number of failed memory cells detecting when first determining whether the data stored in the cells of the memory cell array is the first voltage state or the second voltage state, and the controller further configured to change the second read voltage, which is a voltage for second determining whether the data stored in the cells of the memory cell array is a third voltage state or a fourth voltage state, to the second select read voltage based on a number of failed memory cells detecting when second determining whether the data stored in the cells of the memory cell array is the third voltage state or the fourth voltage state.

17. The memory device of claim 16, wherein each of the one or more cells of the memory cell array comprises a multi-level cell to store more than two bits as data stored in each cell.

18. The memory device of claim 16, wherein the controller does not output the signal to the external device when data is read from the cells applied with the first candidate voltages and the second candidate voltages.

19. The memory device of claim 16, further comprising:
a register to store the applied one of the first candidate voltages and the applied one of the second candidate voltages as the first read voltage and the second read voltage, respectively, such that data can be read regardless of a shift of threshold voltage distributions on the cells.

* * * * *

UNITED STATES PATENT AND TRADEMARK OFFICE
CERTIFICATE OF CORRECTION

PATENT NO. : 9,147,483 B2  
APPLICATION NO. : 14/068122  
DATED : September 29, 2015  
INVENTOR(S) : Hyun-Jun Yoon et al.

Page 1 of 1

It is certified that error appears in the above-identified patent and that said Letters Patent is hereby corrected as shown below:

Title Page, (72) Inventors should read: Hyun-Jun Yoon, Seongnam-si (KR); Jae-Yong Jeong, Yongin-si, (KR); Myung-Hoon Choi, Suwon-si, (KR); Bo-Geun Kim, Suwon-si, (KR); Ki-Tae Park, Seongnam-si, (KR)

Signed and Sealed this  
Fifteenth Day of March, 2016

Michelle K. Lee  
*Director of the United States Patent and Trademark Office*